United States Patent
Fink (10) Patent No.: US 9,746,526 B2
(45) Date of Patent: Aug. 29, 2017

(54) BATTERY CELL UNIT AND METHOD FOR DETERMINING A COMPLEX IMPEDANCE OF A BATTERY CELL ARRANGED IN A BATTERY CELL UNIT

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignees: Robert Bosch GmbH, Stuttgart (DE); Samsung SDI Co., Ltd., Yongin-si, Gyeonggi-do (KR)

(*) Notice: Subject to any disclaimer, the term of this patent is extended or adjusted under 35 U.S.C. 154(b) by 348 days.

(21) Appl. No.: 14/477,145

(22) Filed: Sep. 4, 2014

(65) Prior Publication Data

US 2015/0072198 A1    Mar. 12, 2015

(30) Foreign Application Priority Data

Sep. 10, 2013 (DE) ........................ 10 2013 218 077

(51) Int. Cl.
    *H01M 10/48*      (2006.01)
    *H01M 10/44*      (2006.01)
    (Continued)

(52) U.S. Cl.
    CPC ..... *G01R 31/3624* (2013.01); *G01R 31/3658* (2013.01); *G01R 31/3662* (2013.01);
    (Continued)

(58) Field of Classification Search
    CPC ...... H01M 10/42; H01M 10/48; H02J 7/0021; G01R 31/362; G01R 31/3624; G01R 31/3658
    See application file for complete search history.

(56) References Cited

U.S. PATENT DOCUMENTS

2004/0004464 A1*   1/2004   Tsukamoto ........... H01M 10/44
                                                            320/162
2013/0069661 A1*   3/2013   Rich .................... H01M 10/42
                                                            324/433

FOREIGN PATENT DOCUMENTS

| CN | 101107538 A | 1/2008 |
| DE | 10 2009 046 579 A1 | 5/2011 |
| DE | 10 2011 003 690 A1 | 8/2012 |

* cited by examiner

*Primary Examiner* — Kenneth Douyette
(74) *Attorney, Agent, or Firm* — Maginot, Moore & Beck LLP (57) ABSTRACT

A battery cell unit includes a battery cell and a monitoring device for monitoring the state of the battery cell. The monitoring device comprises an actuating device configured to activate an impedance spectroscopy mode provided by the battery cell unit, in which impedance spectroscopy mode measurement currents can be applied to the battery cell to perform impedance spectroscopy of the battery cell, said measurement currents flowing through the battery cell and comprising alternating currents at different frequencies. The monitoring device also comprises a sensor device designed to detect the measurement currents and the corresponding measurement voltages, each of which is a battery cell voltage arising as a response to a measurement current, such that a complex impedance of the battery cell can be determined from the measured values of the measurement currents and the measurement voltages as a function of the frequency of the measurement currents within predetermined tolerance limits.

6 Claims, 7 Drawing Sheets

(51) Int. Cl.
*G01R 31/36* (2006.01)
*H02J 7/00* (2006.01)
(52) U.S. Cl.
CPC ............ *H01M 10/44* (2013.01); *H01M 10/48* (2013.01); *H02J 7/0021* (2013.01); *Y02T 10/7055* (2013.01)

BATTERY CELL UNIT AND METHOD FOR DETERMINING A COMPLEX IMPEDANCE OF A BATTERY CELL ARRANGED IN A BATTERY CELL UNIT

This application claims priority under 35 U.S.C. §119 to application no. DE 10 2013 218 077.2, filed on Sep. 10, 2013 in Germany, the disclosure of which is incorporated herein by reference in its entirety.

BACKGROUND

The disclosure relates to a battery cell unit with a battery cell and a monitoring device for monitoring the state of the battery cell. The disclosure also relates to a method for determining a complex impedance of a battery cell arranged in a battery cell unit. The disclosure further relates to a vehicle with a battery system which has a battery having a plurality of battery cell units according to the disclosure.

It is conventional to refer to batteries for use in hybrid and electric vehicles as traction batteries since said batteries are used to supply electrical drives. In order to achieve the power and energy data required in the case of hybrid and electric vehicles, individual battery cells in the traction batteries used are connected in series and, in some case, also in parallel. In the case of electric vehicles, often 100 battery cells or more are interconnected in series, with the result that battery voltages of up to 450 V can arise. Also, in the case of hybrid vehicles, the voltage limit of 60 V, which is still rated as noncritical in the case of touching contact by a person, is usually significantly exceeded.

Figure 1:
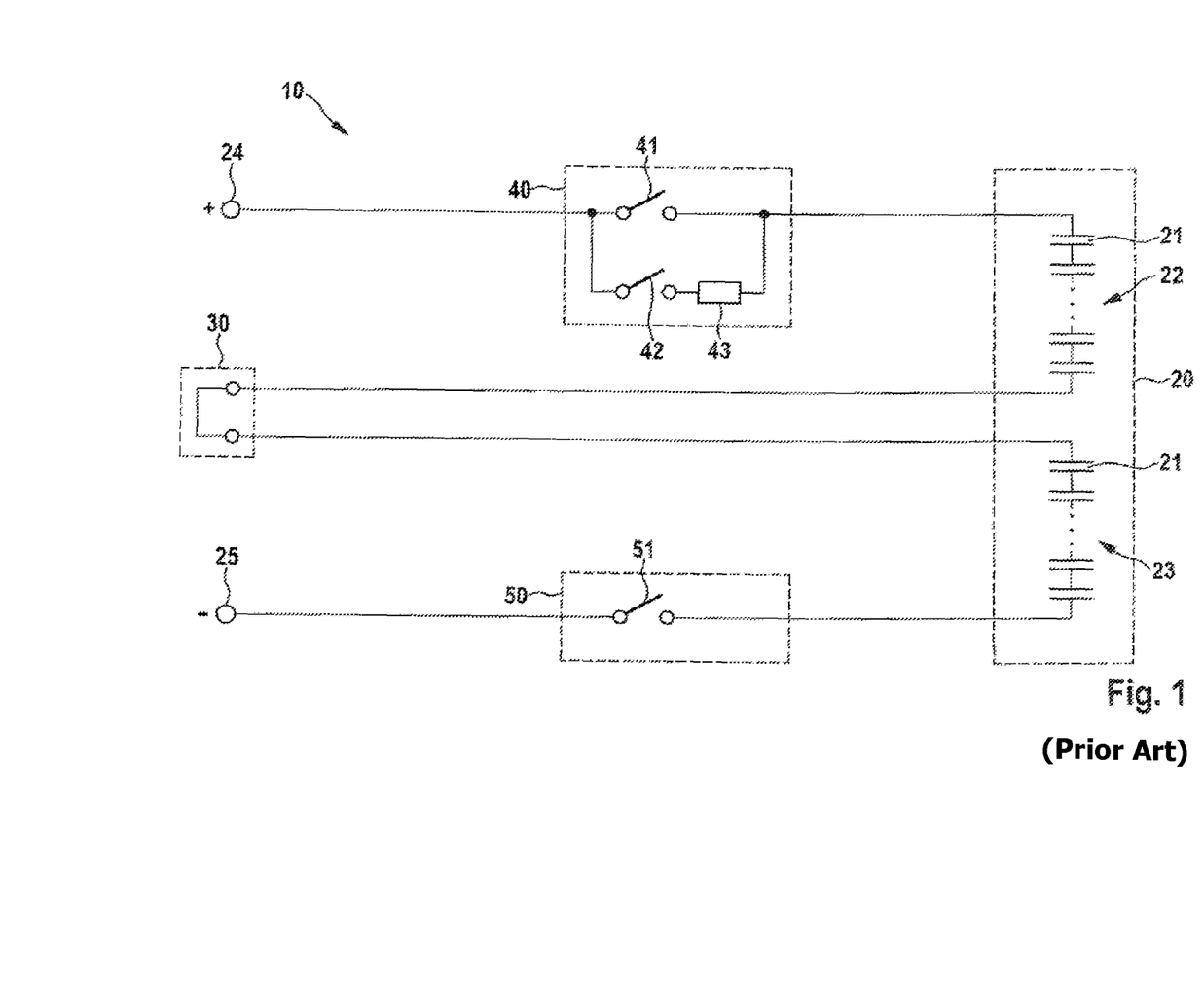
FIG. 1 shows a basic circuit diagram of a battery system known from the prior art having a traction battery.

FIG. 1 illustrates the basic circuit diagram of a battery system 10 with such a traction battery 20. The battery 20 comprises a plurality of battery cells 21. In order to simplify the illustration in FIG. 1, only two battery cells are provided with the reference sign 21.

The battery 20 is formed from two battery cell series circuits 22, 23, which comprise in each case a plurality of series-connected battery cells 21. The battery cell series circuits 22, 23 are connected by their connections in each case to a battery terminal 24, 25 and to a connection of a service plug 30. The positive battery terminal 24 is connectable to the battery 20 via a disconnecting and charging unit 40, which comprises a switch disconnector 41 which is connected in parallel with a series circuit composed of a charging switch 42 and a charging resistor 43. The negative battery terminal 25 is connectable to the battery 20 via a disconnecting unit 50 which comprises a further switch disconnector 51.

Figure 2:
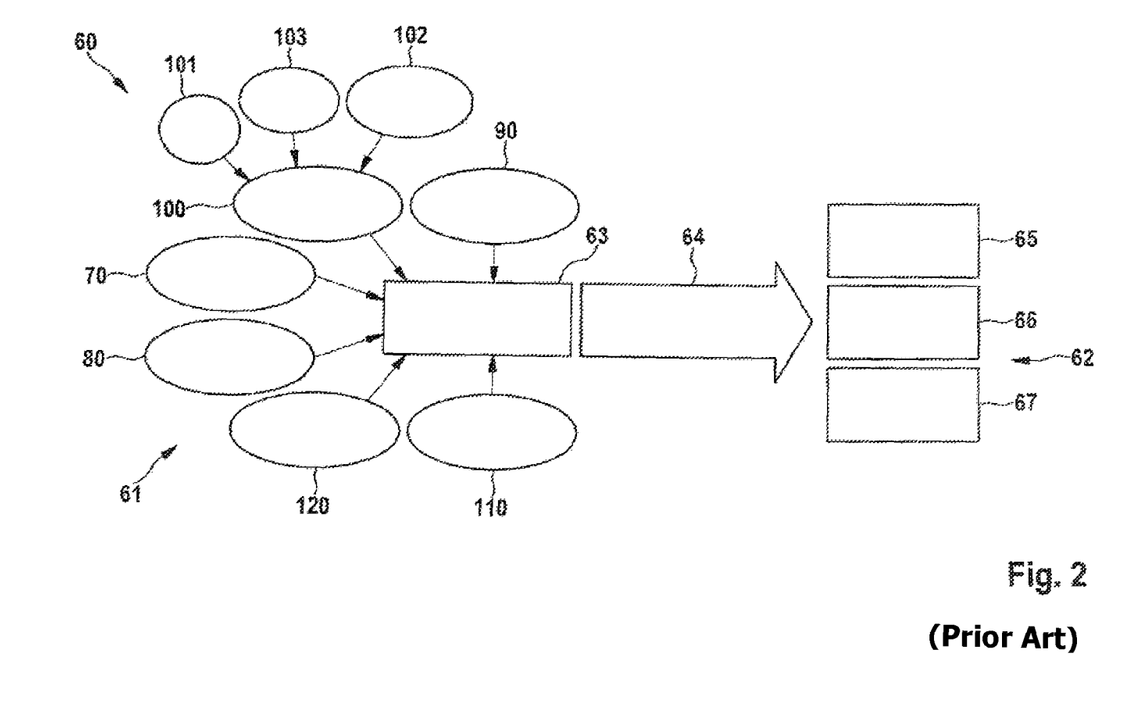
FIG. 2 shows a diagram which illustrates the fault mechanisms of a lithium-ion battery known from the prior art, which can lead to a thermal runaway of said lithium-ion battery.

FIG. 2 shows a diagram 60, which illustrates in a highly schematic manner the fault mechanisms 61 of lithium-ion batteries and their consequences 62. The illustrated fault mechanisms 61 can lead to thermal runaway 64 of the battery cells 21 caused by an impermissible increase 63 in temperature. In the event of the presence of a thermal runaway 64, an emission of gas 65, which, for example, can arise on opening of a rupture valve as a consequence of increased battery cell internal pressure, a fire 66 in the battery cells or, in an extreme case, even rupture 67 of the battery cells 21 can occur. Therefore, the occurrence of thermal runaway 64 when using the battery cells 21 in traction batteries needs to be ruled out with the greatest possible probability of close to 1.

Thermal runaway 64 can occur in the case of overcharging 70 of a battery cell, as a consequence of deep discharge 80 of a battery cell 21 during the subsequent charging operation or in the event of the presence of impermissibly high charging and discharge currents of the battery cell 21 which can result from an external short circuit 90, for example. In addition, thermal runaway 64 can also occur in the event of the presence of a battery cell-internal short circuit 100, which can arise, for example, as a consequence of a severe mechanical force effect during an accident 101 or as a consequence of the formation of battery cell-internal dendrites 102, which can arise, for example, in the event of the presence of excessively high charging currents at low temperatures. Furthermore, thermal runaway 64 can also occur as a result of battery cell-internal short circuits which can be caused by impurities in the battery cells 21 resulting during manufacture, in particular by metallic foreign particles 103 present in the battery cells 21. Thermal runaway 64 can also occur in the event of the presence of impermissible heating of the battery cells 21 which can arise, for example, as a consequence of a vehicle fire or in the event of the presence of an overload 120 of the battery cells 21.

Safety tests are prescribed for lithium-ion battery cells. In order to be able to transport the battery cells 21, for example, UN transport tests must be performed. The test results must be assessed according to the EUCAR Hazard Levels. Here, the battery cells 21 must meet predefined minimum safety levels. In order to achieve this, comprehensive additional measures are found in battery cells 21 which are designed for use in traction batteries. Such additional measures are met such that so-called safety devices are integrated in the battery cells. The safety devices specified in the following text are typically integrated.

An overcharge safety device (OSD) is integrated in a battery cell 21. Such an overcharge safety device has the effect that the battery cell 21 does not exceed an EUCAR hazard level 4 during an overcharging operation. The permissible range for the battery cell voltage ends at 4.2 V. In the case of an overcharging operation, above a battery cell voltage of approximately 5 V, such a high internal pressure builds up in the battery cell 21 that a membrane of the overcharge safety device curves outwards and the battery cell 21 is electrically short-circuited. As a result of this, the battery cell 21 is discharged until a battery cell-internal fuse is activated. The short circuit in the battery cell 21 between the two battery cell terminals is maintained via the overcharge safety device.

A battery cell fuse is also integrated in a battery cell 21. This fuse integrated in the battery cell 21 is a very effective protective instrument on a battery cell level, but causes considerable problems when using the battery cells 21 to construct a series circuit in a battery module or in a battery system. In these cases these measures are rather counterproductive.

A nail penetration safety device (NDS) is often also integrated in a battery cell 21. Said nail penetration safety device protects the battery cell 21 by virtue of a defined short-circuit path which does not result in such severe local heating of the battery cell in the region of the nail penetration that local melting of the separator provided could result being constructed when a nail penetrates into the battery cell 21.

A safety function layer (SFL) is also integrated in a battery cell 21. The safety function layer is realized by the ceramic coating of one of the two electrodes, preferably by the ceramic coating of the anode. In the event of melting of the separator, an areal short circuit of the battery cell 21 and therefore extremely rapid conversion of the electrical energy from the battery cell 21 into lost heat can be prevented by means of the safety function layer.

A crush safety device is in addition also integrated in a battery cell 21. The crush safety device has a similar mode of operation to the nail penetration safety device. In the event of a severe mechanical deformation of the battery cell housing, a defined short-circuit path is provided in the battery cell 21 which prevents severe local heating of the battery cell 21 and thus increases the safety of the battery cell 21.

In the battery cells 21 under development at present, in particular the measures for the electrical safety which protect against overcharging, for example, or ensure overcurrent protection are associated with considerable complexity. In addition, these measures tend to be even rather counterproductive instead of expedient once a battery cell 21 is used in a battery module or in a battery system. For example, on activation of the fuse of a battery cell 21, the situation may arise whereby the electronics of the existing battery management system (BMS) are subject to very high negative voltages. This results in additional complexity on the battery system level since the transport regulations at the battery cell level need to be adhered to without any benefit being associated with this.

Figure 3:
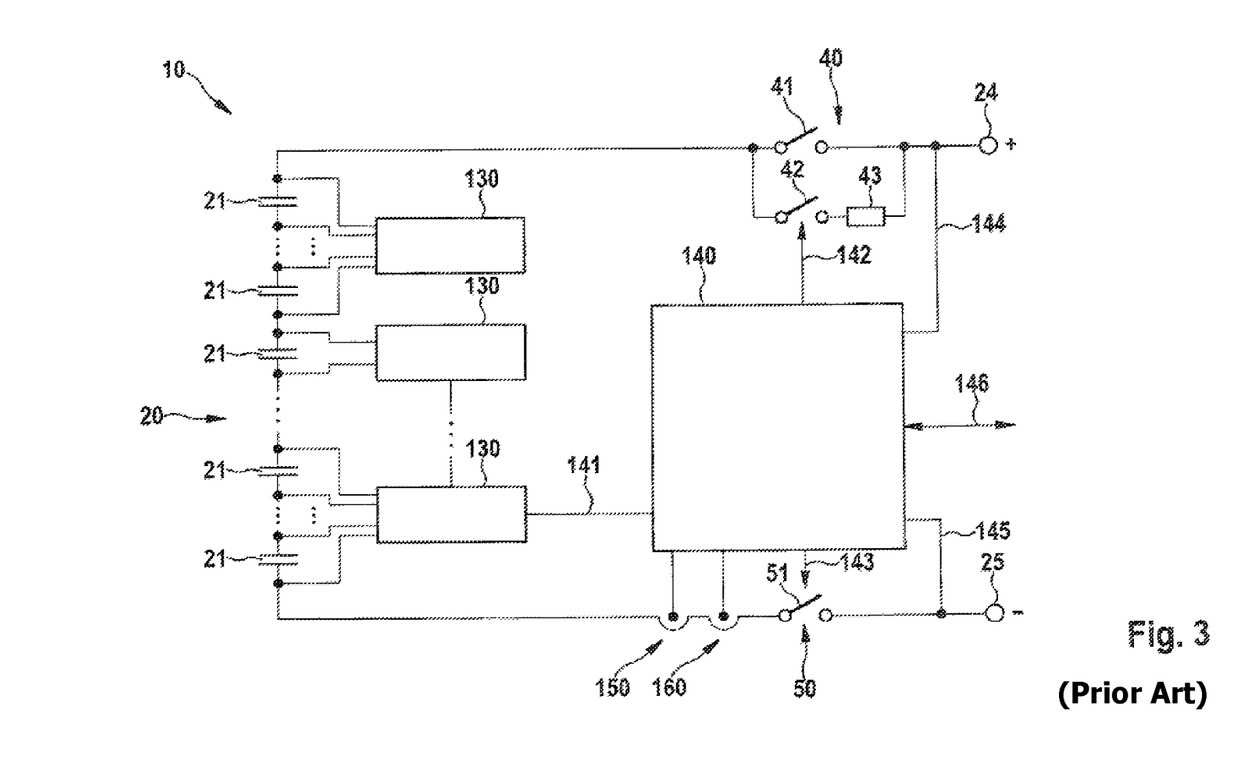
FIG. 3 shows a basic circuit diagram of a battery system known from the prior art having a traction battery formed from a plurality of battery cells and a battery management system.

FIG. 3 illustrates the basic circuit diagram of a battery system 10 known from the prior art which comprises a traction battery 20 with a plurality of battery cells 21 and a battery management system. The electronics of the battery management system (BMS) have a decentralized architecture, in which the cell monitoring units 130 formed from the monitoring electronics (CSC electronics) of the battery cells 21 are in the form of satellites, are each provided for monitoring the function state of one or more battery cells 21 and communicate with a central battery control device (BCU) 140 via an internal bus system 141.

The electronics of the battery management system, in particular the monitoring electronics of the battery cells 21, are necessary in order to protect the battery cells 21 from the critical states illustrated in FIG. 2, which can result in thermal runaway. A high degree of complexity is involved in the electronics of the battery management system in order firstly to protect the battery cells 21 from overload due to external causes such as, for example, due to a short circuit in the inverter of an electric drive, and secondly to avoid a situation whereby the battery cells are endangered by malfunction of the electronics of the battery management system, such as, for example, by faulty detection of the battery cell voltages by the cell monitoring units 130.

As is the case for the battery system 10 illustrated in FIG. 1, in the battery system 10 illustrated in FIG. 3 the traction battery 20 is connectable to a positive battery terminal 24 via a disconnecting and charging device 40 and is connectable to a negative battery terminal 25 via a disconnecting device 50. In this case, in each case the same reference signs have been used for denoting identical components for the battery systems illustrated in FIGS. 1 and 3.

In addition, the central battery control device 140 is designed to actuate the switch disconnector (relay) 41 and the charging switch (relay) 42 of the disconnecting and charging device 40. The actuation of the switch disconnector 41 and the charging switch 42 by means of the battery control device 140 is symbolized by the arrow 142 here. The central battery control device 140 is also designed to actuate the further switch disconnector (relay) 51 of the disconnecting device 50. The actuation of the switch disconnector 51 by means of the battery control device 140 is symbolized by the arrow 143.

The central battery control device 140 is connected to a respective other battery terminal 24, 25 in each case via a high-voltage line 144, 145. In addition, the central battery control device 140 comprises current sensors 150, 160, which are provided for measuring the current flowing through the traction battery 20. The battery control device 140 also communicates with a vehicle interface via a CAN bus 146. Information relating to the function state of the vehicle can be provided to the battery control device 140 via the CAN bus.

When using a battery management system of a battery system known from the prior art, it is therefore desired to increase the safety of the battery system 10 such that no unreasonable risk occurs. In doing so, pursuant to ISO 26262, stringent requirements are placed on the functional safety of the battery management system since a malfunction of the electronics can result in a risk. For battery management systems in electric vehicles and plug-in hybrids, presumably grading in accordance with the hazard level ASIL C will be established if the safety of the battery cells 21 cannot be significantly increased.

SUMMARY

According to the disclosure, provision is made of a battery cell unit with a battery cell and a monitoring device for monitoring the state of the battery cell. The monitoring device comprises an actuating device which is configured to activate an impedance spectroscopy mode provided by the monitoring device. In the impedance spectroscopy mode, measurement currents can be applied to the battery cell in order to perform impedance spectroscopy of the battery cell, said measurement currents comprising alternating currents at different frequencies. Furthermore, the monitoring device comprises a sensor device which is designed to detect the measurement currents and the corresponding measurement voltages, which are battery cell voltages which arise as a response to a measurement current, such that a complex impedance of the battery cell can be determined from the measured values of the measurement currents and the measurement voltages as a function of the frequency of the measurement currents within predetermined tolerance limits.

The disclosure also provides a method for determining a complex impedance of a battery cell arranged in a battery cell unit. In the case of the method, the battery cell is operated in an impedance spectroscopy mode provided by the battery cell unit and activated by means of an actuator device arranged in the battery cell. In the impedance spectroscopy mode, measurement currents are applied to the battery cell in order to perform impedance spectroscopy of the battery cell, said measurement currents comprising alternating currents at different frequencies. Furthermore, the measurement currents and the corresponding measurement voltages, which arise in each case as a response to a measurement current, are detected by a sensor device arranged in the battery cell unit such that a present complex impedance of the battery cell is determined from the measured values of the measurement currents and the measurement voltages provided by the sensor device as a function of the frequency of the measurement currents within predetermined tolerance limits.

In the case of the battery cell unit according to the disclosure, the sensor device must be embodied such that the requirements for the performance of impedance spectroscopy are fulfilled.

By means of impedance spectroscopy, detailed information can be obtained about the state of a battery cell, which information is not available in the case of monitoring of the battery cell performed according to the prior art by means of simple detection of the current, voltage and temperature of said battery cell. Said information can be used to identify the state of charge (SOC), state of health (SOH) or the ability of the battery cell to fulfill a desired functionality (state of function (SOF)) substantially more precisely than with the measurement methods known from the prior art. Furthermore, the information obtained by means of impedance spectroscopy can also be used to significantly increase the safety of the battery cells and the battery systems constructed therewith.

According to the disclosure, provision is made of a battery cell unit with a battery cell and a monitoring device or monitoring electronics according to the disclosure. The monitoring electronics according to the disclosure can also be integrated in the battery cell. A battery cell with integrated monitoring electronics according to disclosure is also referred to in the following text as having intrinsic electrical safety or (simply) as a battery cell with intrinsic electrical safety.

A battery cell with intrinsic electrical safety having an electrochemical battery cell, in particular an electrochemical lithium-ion battery cell, preferably comprises a sensor system (sensor device) for detecting physical variables for identifying the state of the battery cell, a battery state detection and prediction device (state identification device) which identifies, from the sensor signals, the present state of the battery cell, in particular in terms of its safety, and can also predict (forecast) the future behavior of the battery cell, and a safety actuator (actuator device) with which the battery cell can be transferred into a safe state, as required, when it is detected that a state and/or operation of the battery cell is becoming critical.

Preferably, safety functions are integrated in the battery cell with intrinsic electrical safety, which safety functions immediately transfer the battery cell into a safe operating mode in the event of a critical state of the battery cell or one which is becoming critical.

The realization of the diagnosis of a battery cell with intrinsic electrical safety according to the disclosure, in particular a lithium-ion battery cell with intrinsic electrical safety on the basis of impedance spectroscopy is described in particular in the following text. Preferably, the battery cell with intrinsic electrical safety according to the disclosure has its own sensor and actuator electronics for realizing the intrinsic electrical safety, which sensor and actuator electronics then can be used without any appreciable additional complexity in order to perform impedance spectroscopy.

In the case of a particularly preferred embodiment of the battery cell unit according to the disclosure, the sensor device is designed to detect the measurement currents and the measurement voltages within predetermined tolerance limits simultaneously and/or in each case with a predetermined repetition rate and/or to perform the measurement of the measurement currents and the measurement voltages in each case with a predetermined measurement accuracy.

Expressed simply, the sensors of a battery cell with intrinsic electrical safety preferably have to be configured such that the requirements for performing impedance spectroscopy in terms of the temporal synchronization and/or the repetition rate of detection of the battery cell voltage and the battery cell current and/or in terms of the requirements of accuracy of said two signals are fulfilled.

In the case of another very preferred embodiment of the battery cell unit according to the disclosure, the monitoring device comprises a state identification device which is designed to determine, on the basis of an evaluation of the measured values of the measurement currents and measurement voltages provided by the sensor device, the amplitudes of the measurement currents and the measurement voltages and the phase shifts between the measurement currents and the corresponding measurement voltages and to determine, from the determined amplitudes and phase shifts, the complex impedance of the battery cell as a function of the frequency of the measurement currents within the predetermined tolerance limits and to record the complex impedance of the battery cell as a function of the frequency of the measurement currents. Preferably, the state identification device is designed to evaluate the dependency of the complex impedance on the frequency of the measurement currents in order to obtain information about a present or future state of the battery cell.

Thus, in the case of suitable configuration of the sensors used in a battery cell with intrinsic electrical safety for detecting the battery cell voltage and the battery cell current, impedance spectroscopy can be performed. Hence, significantly better information about the state of the battery cell is preferably available for the battery state detection and prediction than the information about the state of the battery cell which can be obtained according to the present prior art. This information can be used in order to improve the quality of the battery state detection and prediction and/or to increase the safety of a battery cell with intrinsic electrical safety or a battery system having battery cells with intrinsic electrical safety.

In the case of a very advantageous embodiment of the battery cell unit according to the disclosure, the monitoring device comprises an ultra-fast discharge device, which is provided for discharging the battery cell with a predetermined discharge current, and has a power semiconductor connected to the battery cell poles. The monitoring device preferably comprises a first voltage setting device which is provided for setting a voltage present at the battery cell terminals, which voltage corresponds to the battery cell voltage in positive orientation or to a voltage of 0 V, and has a half-bridge having two power semiconductors which are in each case directly connected to another one of the battery cell poles. The monitoring device further preferably comprises a second voltage setting device which has two half-bridges with in each case two power semiconductors and is provided for setting a voltage present at the battery cell terminals, which voltage corresponds to the battery cell voltage in positive or negative orientation. In this case, the power semiconductors are in each case directly connected to another one of the battery cell poles. The power semiconductor (switches) of the ultra-fast discharge device and/or at least one of the power semiconductors of the first or the second voltage setting device are configured for operation in the active region. The monitoring device further comprises an actuation device which is designed to operate, in the impedance spectroscopy mode, the appropriately configured power semiconductor switch of the ultra-fast discharge device and/or the at least one appropriately configured power semiconductor of the first and/or the second voltage setting device in the active region and as linearly operating actuator, by means of which a regulating circuit for regulating a current flowing through the battery cell is realizable. In this case, sinusoidal current profiles at different frequencies are predefinable for the regulating circuit, which is realizable in the impedance spectroscopy mode, as nominal predefined value for the measurement currents which can be applied to the battery cell in the impedance spectroscopy mode.

In this case, it is also advantageous in the case of this embodiment of the battery cell unit according to the disclosure having an ultra-fast discharge device and/or first and/or second voltage setting device for important information about the state of the battery cell to be able to be obtained from the profile of the complex impedance of the battery cell as a function of the frequency of the measurement currents without much extra complexity.

Expressed simply, a battery cell with intrinsic electrical safety can optionally comprise additional electronics (first and/or second voltage setting device), also referred to as switching actuator mechanism, by means of which the output voltage of the battery cell can be switched such that the battery cell voltage can be present across the battery cell terminals in a positive orientation or the battery cell voltage can be present across the battery cell terminals in a negative orientation or a voltage of 0 V can be present across the battery cell terminals. In this case, the safety actuator mechanism and the voltage setting electronics must be configured here such that the battery cell with intrinsic electrical safety can be operated in an impedance spectroscopy mode in which impedance spectroscopy of the battery cell can be performed.

In the case of a very preferred embodiment of the battery cell unit according to the disclosure, the power semiconductor of the first voltage setting device which is directly connected to the positive battery pole is configured for operation in the active region. In this case, the power semiconductor of the first voltage setting device which is directly connected to the negative battery pole is provided for conducting an external current flowing between the battery cell terminals via a current path which is external to the battery cell. Preferably, at least one of the two power semiconductors of the second voltage setting device which are directly connected to the positive battery cell pole or the negative battery cell pole is configured for operation in the active region. In this case, the two power semiconductors of the second voltage setting device which are directly connected to the negative battery pole or the positive battery pole are provided for conducting an external current flowing between the battery cell terminals via a current path which is external to the battery cell.

It is very advantageous in the case of the embodiment of the battery cell unit according to the disclosure having the first and/or the second voltage setting device that it is possible for the impedance spectroscopy to be performed in a very simple manner, by at least one of the power semiconductors of the first and/or second voltage setting device being configured for operation in the active region and being able to be operated in the active region, while such external currents flowing between the battery cell terminals which are not intended to be conducted via the battery cell can furthermore flow directly through at least one further power semiconductor switch of the first and/or second voltage setting device, which further power semiconductor switch is configured for switching operation and operates in switching operation.

The battery cell of the battery cell unit according to the disclosure is preferably a lithium-ion battery cell.

Preferably, the method according to the disclosure comprises the functional features of the battery cell unit according to the disclosure, either individually or in combination.

Preferably, in the case of the method according to the disclosure, at least one power semiconductor switch arranged in the battery cell unit and configured to operate in the active region and connectable to the battery cell poles is operated in the active region and is connected to the battery cell poles such that the at least one power semiconductor forms a linearly operating actuator of a regulating circuit for regulating a current flowing through the battery cell. In the case of the method according to the disclosure, sinusoidal current profiles at different frequencies are predefined for the regulating circuit realized in the impedance spectroscopy mode as nominal predefined value for the measurement currents which are applied to the battery cell in the impedance spectroscopy mode.

Another aspect of the disclosure relates to a battery system with a battery having a plurality of battery cell units according to the disclosure.

Another aspect of the disclosure relates to a vehicle having a battery system with a battery having a plurality of battery cell units according to the disclosure.

BRIEF DESCRIPTION OF THE DRAWINGS

Exemplary embodiments of the disclosure are presented in the drawings and are explained in more detail in the description below.

In the drawings.

DETAILED DESCRIPTION

Figure 4:
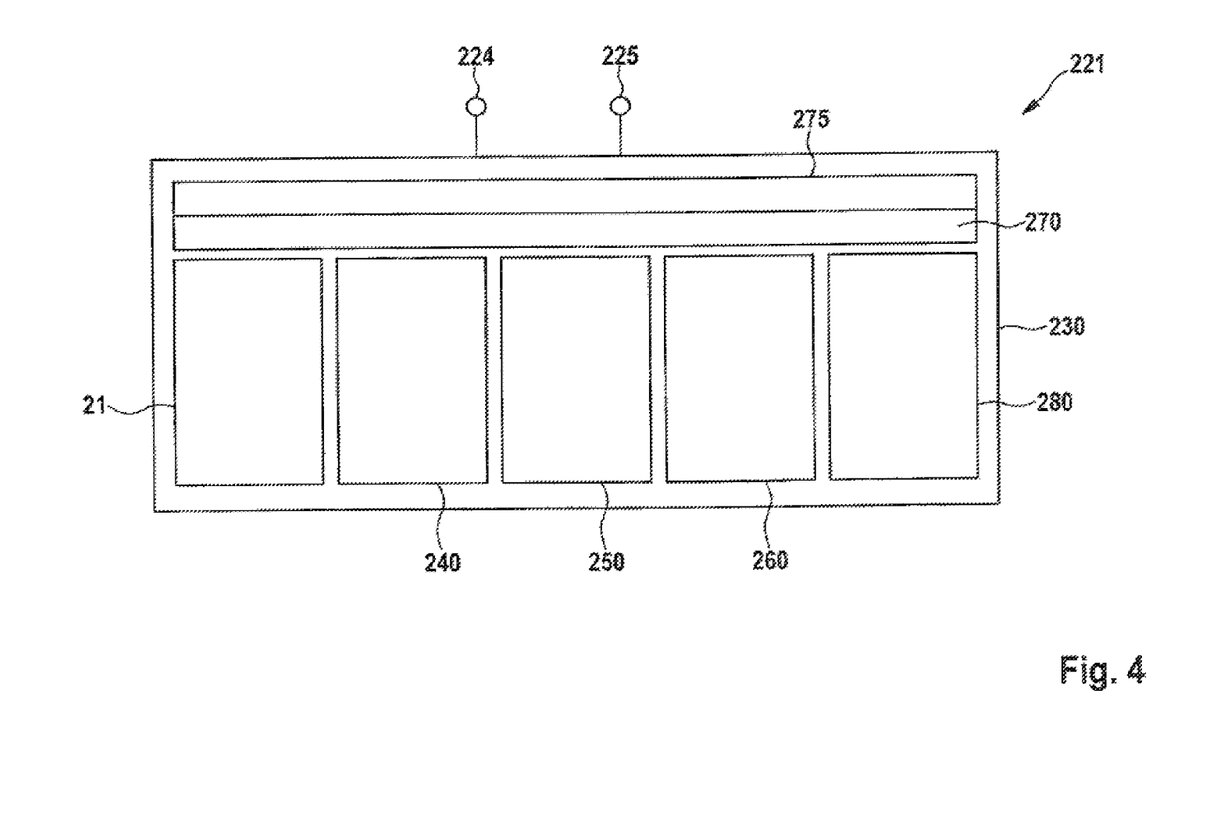
FIG. 4 is the basic circuit diagram of a battery cell unit according to a first embodiment of the disclosure.

FIG. 4 illustrates the basic circuit diagram of a battery cell unit 221 according to a first embodiment of the disclosure. The battery cell unit 221 comprises a battery cell 21, in particular a lithium-ion battery cell. The battery cell unit 221 further comprises a sensor device (sensors) 240 for detecting physical variables in order to identify the state of the battery cell, a state identification device 250 (battery cell state detection and prediction) which detects, from the sensor signals, the present state of the battery cell, in particular in terms of its safety, and can also forecast or predict the future behavior of the battery cell 21, and an actuator device (safety actuators) 260 by means of which the battery cell 21 can be transferred into a safe operating mode in the event that it is detected that a state of the battery cell is becoming critical.

Furthermore, safety functions 270 can be provided by the battery cell unit 221, which safety functions immediately transfer the battery cell 21 into a safe operating mode in the event of a critical state of the battery cell or one which is becoming critical. Furthermore, an impedance spectroscopy mode 275 can be provided by the battery cell unit 221, in which impedance spectroscopy mode measurement currents which flow through the battery cell 21 and comprise alternating currents at different frequencies can be applied to the battery cell in order to perform impedance spectroscopy of the battery cell 21. In this case, the sensor device 240 is designed to detect and monitor the battery cell voltage and to detect a current flowing through the battery cell. The sensor device 240 is also designed to detect the measurement currents flowing through the battery cell 21 in the impedance spectroscopy mode 275 and to detect the corresponding measurement voltages which are in each case a battery cell voltage which arises as a response to a measurement current, such that, from the measured values of the measurement currents and the measurement voltages, a complex impedance of the battery cell 21 as a function of the frequency of the measurement currents within predetermined tolerance limits can be determined.

Preferably, the sensor device 240 is designed to detect a battery cell temperature and/or also a battery cell internal pressure and/or a linear acceleration and/or a rotary acceleration of the battery cell 21.

The state identification device 250 is designed to determine, from the measured values of the measurement currents and measurement voltages provided by the sensor device 240, the amplitudes of the measurement currents and the measurement voltages and the phase shifts between the measurement currents and the corresponding measurement voltages and to determine, from the determined amplitudes and phase shifts, and to record the complex impedance of the battery cell 21 as a function of the frequency of the measurement currents within the predetermined tolerance limits and to evaluate the dependency of the complex impedance on the frequency of the measurement currents, in order to obtain information about a present or future state of the battery cell.

The actuator device 260 is designed to activate the impedance spectroscopy mode 275 provided by the battery cell unit 221.

The actuator device 260 is further preferably designed to activate a discharge device (not separately illustrated) arranged in the battery cell unit 221. The discharge device is designed to discharge the battery cell 21 with suitable discharge currents. The discharge device preferably comprises an ultra-fast discharge device which is designed to discharge the battery cell by means of high discharge currents close to the short-circuit current.

Furthermore, the actuator device 260 is preferably designed also to activate a current bypass (not separately illustrated) arranged in the battery cell unit 221, which current bypass is designed to divert, in the activated state, a current flowing between the battery cell terminals 224, 225 of both polarities via a current path which is external to the battery cell.

Optionally, the battery cell unit 221 according to the disclosure comprises a voltage setting device (switching actuator mechanism) 280 which is designed to switch the output voltage of the battery cell 21 such that the battery cell 21 can output across the battery cell terminals 224, 225 the battery cell voltage in a positive orientation or no voltage (0 V) or the battery cell voltage in a negative orientation.

The monitoring device 230 of the battery cell unit 221 according to the disclosure illustrated in FIG. 4 comprises the previously mentioned electronic components (the sensor device 240, the state identification device 250, the actuator device 260 and, preferably, also the voltage setting device 280) and functionalities (for example the safety functions 270 and/or the impedance spectroscopy mode 275) of the battery cell unit 221. A battery cell unit 221 according to the first embodiment of the disclosure is referred to as battery cell having intrinsic electrical safety when the monitoring device 230 of the battery cell unit 221 is integrated in the battery cell 21.

Figure 5:
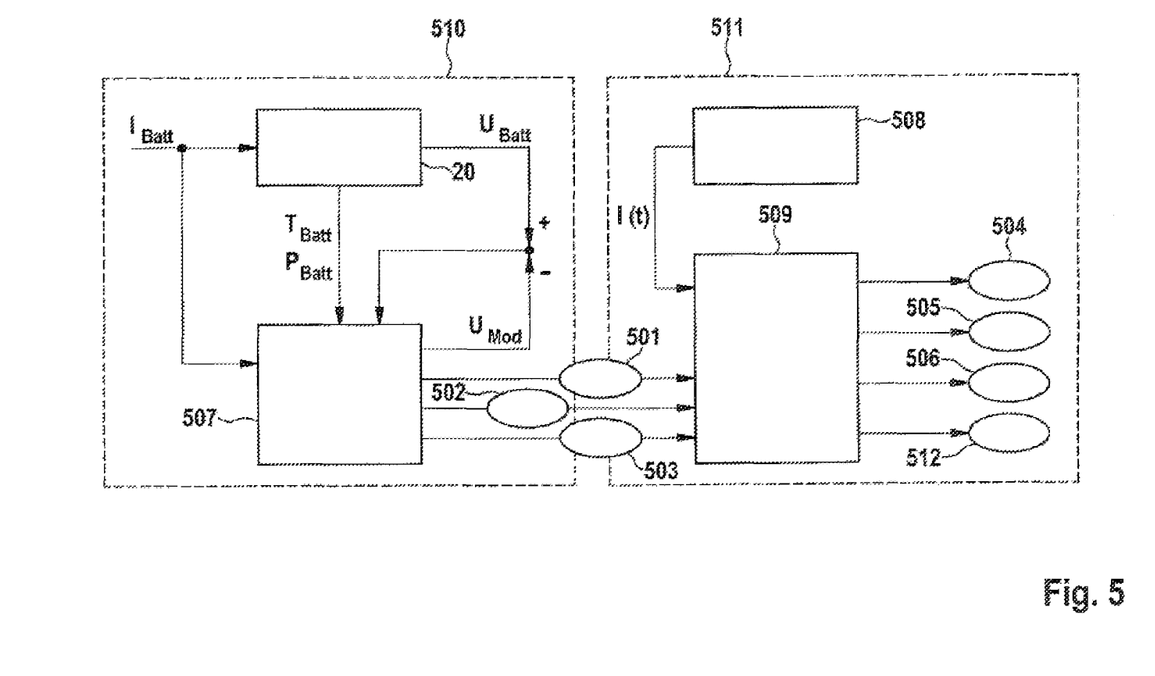
FIG. 5 is a flow chart of a model-based state identification and prediction, by means of which the detection and/or forecast according to the disclosure of a state of a battery cell can be performed, according to an embodiment of the disclosure.

FIG. 5 shows the flow chart of a model-based state identification and prediction with which the detection and/or forecast according to the disclosure of a state of a battery cell can be performed. The state identification 510 is performed on a battery 20 in which a plurality of battery cell units 221 according to the disclosure can be arranged. The state identification 510 is performed by the state identification device 250 according to the disclosure, which state identification device acts as observer and implements a battery model 507 with parameter adaptation. As is shown in FIG. 5, the battery model 507 obtains present measured values from different physical variables relating to the battery 20. These comprise, in particular, a present battery cell current $I_{Batt}$, a battery cell temperature $T_{Batt}$ and a battery cell internal pressure $P_{Batt}$. In this case, the battery cells 21 can be operated in the impedance spectroscopy mode 275 and a measurement current is applied to said battery cells, which measurement current is the same as the present battery cell current $I_{Batt}$ in this case. A present state of the battery is identified by the state identification device 250 using the battery model 507. The battery model 507 and the state identified therefrom are continuously checked on the basis of present measured values. Thus, for example, a suitable model-based battery cell voltage $U_{Mod}$ can be compared with a measured present battery voltage $U_{Batt}$. In this case, on the basis of the comparison and a deviation determined in the process, the battery model 507 applied can be correspondingly configured.

The battery model also provides estimations or calculated values about a state of charge (SOC) 501, a state of health (SOH) 502 and a state of safety 503 which are forwarded as input variables to a further battery model 509 with state prediction for processing in the context of battery state prediction 511. The battery state prediction also obtains further information 508 which is relevant to the accuracy of the forecast, which information in particular comprises load profiles and boundary conditions. By way of example, the information can contain stored values with the temporal profile of a charging current I(t) which enter the battery model 509 as further parameter. The input data 501, 502, 503, I(t) are subsequently processed using the battery model 509 and forecasts are output. In particular, forecasts are made about the battery power 504, the energy 505 stored or stored in the battery 20, the state of function (SOF) 506 of the battery 20 or the foreseeable safety state 512 of the battery 20. Thus, the foreseeable safety state 512 or the present safety state 503 can indicate whether a normal operating state of the battery 20 is present or whether the battery 20 is in a critical state.

Figure 6:
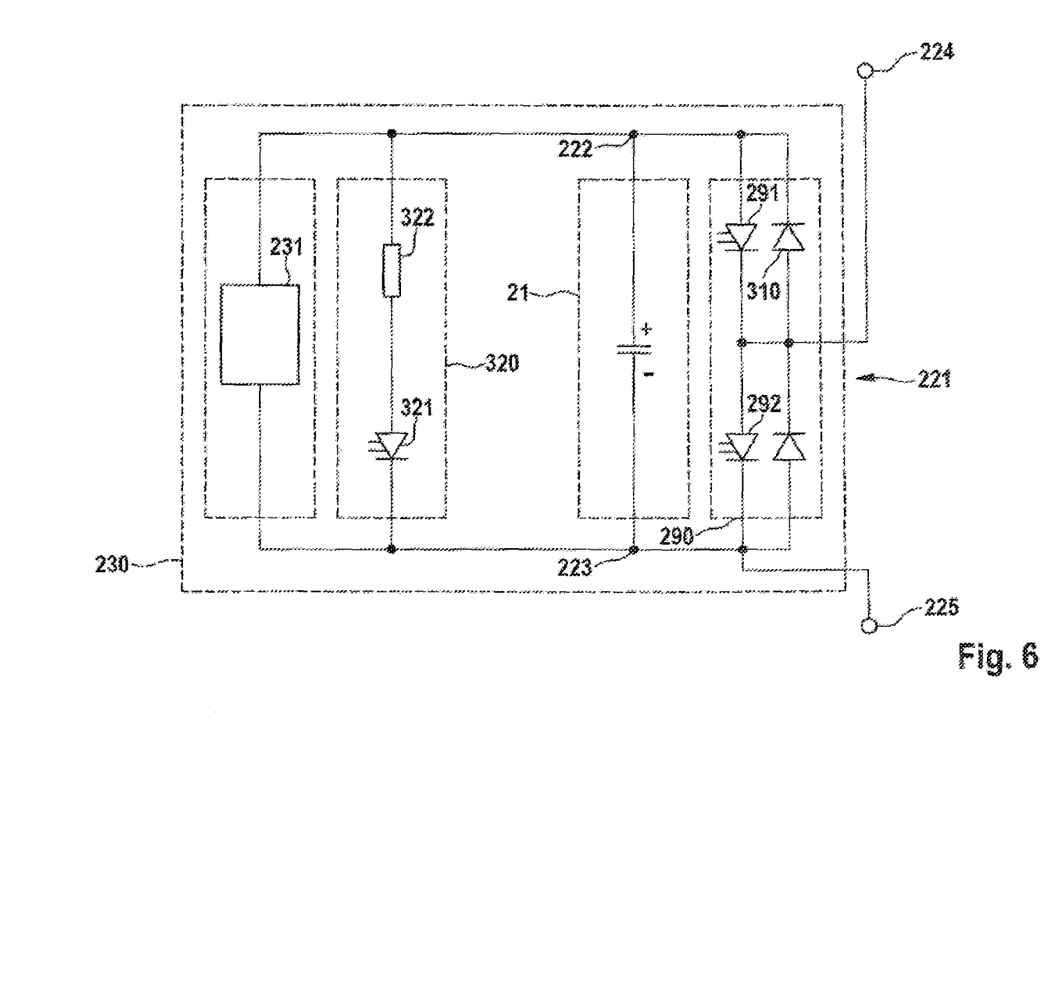
FIG. 6 is the basic circuit diagram of a battery cell unit according to a second embodiment of the disclosure.

FIG. 6 illustrates the basic circuit diagram of a battery cell unit 221 according to a second embodiment of the disclosure. This battery cell unit 221 comprises a battery cell 21 and a monitoring device 230 for monitoring the state of the battery cell. The monitoring device 230 comprises a switching actuator mechanism which in this case comprises a first voltage setting device which is provided to set a voltage which is present across the battery cell terminals 224, 225 and corresponds to the battery cell voltage in positive orientation or a voltage of 0 V.

The first voltage setting device is formed from a half-bridge 290 having two power semiconductors (power semiconductor switches) 291 and 292. A diode 310 is connected in each case in parallel with the power semiconductors 291, 292, the forward direction of which diodes runs contrary to the forward direction of the corresponding power semiconductor 291, 292. In order to simplify the illustration, only one of the two diodes of the half-bridge 290 is provided with the reference sign 310.

The power semiconductor 291 of the half-bridge is directly connected to the positive battery cell pole 222 at a first connection of the half-bridge 290. The other power semiconductor 292 of the half-bridge 290 is directly connected to the negative battery cell pole 223 at a second connection of the half-bridge 290. Said half-bridge 290 is also directly connected to a first battery cell terminal 224 of the battery cell unit 221 at a central connection. The second connection of the half-bridge 290, which is connected to the negative battery cell pole 223, is additionally also connected to a second battery cell terminal 225.

The battery cell unit 221 according to the second embodiment of the disclosure comprises an ultra-fast discharge device (UFDD) 320 which has a series circuit composed of a power semiconductor (power semiconductor switch) 321 and a resistor 322 connected between the positive battery cell pole 222 and the negative battery cell pole 223. The ultra-fast discharge device 320 is provided in the battery cell unit 221 for discharging the battery cell 21 by means of a discharge current flowing through the ultra-fast discharge device 320.

The monitoring device 230 of the battery cell unit 221 according to the second embodiment of the disclosure also comprises a monitoring unit 231, which comprises a control device (control circuit) for controlling the three power semiconductors 291, 292, 321 and is not separately illustrated, connected between the battery cell poles 222, 223.

The power semiconductors 291, 292 of the half-bridge 290 can be controlled by means of the control device such that they operate in switching operation. In this case, the power semiconductors 291, 292 operating in switching operation can be switched by means of the control device such that the battery cell 21 can output the battery cell voltage across the battery cell terminals 224, 225 in positive or a voltage of 0 V.

The power semiconductor (power semiconductor switch) 321 of the ultra-fast discharge device 320 can be controlled by means of the control device in switching operation such that the battery cell 21 can be discharged by means of a discharge current close to the short-circuit current flowing through the ultra-fast discharge device 320.

The power semiconductors 291, 292 of the first voltage setting device and/or the power semiconductor 321 of the ultra-fast discharge device 320 can in each case be designed as metal oxide semiconductor field-effect transistors (MOSFETs).

If the monitoring device 230 of the battery cell unit 221 is integrated in the battery cell 21, the battery cell unit 221 according to the second embodiment of the disclosure forms a battery cell with intrinsic electrical safety with switchable output voltage and ultra-fast discharge device.

In order to be able to perform impedance spectroscopy with the arrangement illustrated in FIG. 6, either the power semiconductor 321 in the ultra-fast discharge device 320 and/or at least one of the power semiconductors 291, 292 of the half-bridge 290 must be configured such that the power semiconductor can be operated in the active region. In order to be able to operate a power semiconductor in the active region, the control device of the battery cell unit 221 according to the second embodiment must be configured such that it can control the at least one power semiconductor switch configured for operation in the active region in a linear fashion. In the case of standard controllers, this is usually not the case since power semiconductors are usually only used in switching operation. However, the extra complexity for linear control of power semiconductors is low.

By means of the at least one power semiconductor of the power semiconductors 291, 292, 321 which is controllable in the active region, it is possible to realize current regulation. Using the actively operated power semiconductor, a linearly operating actuator is then provided, by means of which a current regulating circuit is realized for the current which flows through the battery cell (the electrochemical part of the battery cell unit) 21.

If the power semiconductor 291 of the half-bridge 290 which is directly connected to the positive battery cell pole 222 is configured for operation in the active region (active operation), the battery cell 21 can optionally be operated via the power semiconductor 292 in the current bypass for conducting the external currents (bypass currents), or vice versa, if the power semiconductor 292 of the half-bridge 290 which is directly connected to the negative battery cell pole 223 is used for impedance spectroscopy.

In order to perform impedance spectroscopy, a sinusoidal current profile is expediently predefined as nominal predefined value for the battery cell current for the current regulating circuit realized by means of the at least one power semiconductor operated in the active region. In order to detect the battery cell current and the voltage response of the battery cell 21, a sensor device (sensors) of the battery cell unit 221 which is arranged in the monitoring unit 231 and is not separately illustrated here is used. The complex internal resistance of the battery cell 21 over the frequency can be determined and/or recorded from the amplitude of the profile of the battery cell current, the phase shift and the amplitude of the voltage response of the battery cell 21, preferably by means of a state identification device of the battery cell unit (battery cell state detection and prediction) 221 which is arranged in the monitoring unit 231 and is not separately illustrated here. Important information about the state of the battery cell can be obtained from the profile of the impedance over the frequency.

Figure 7:
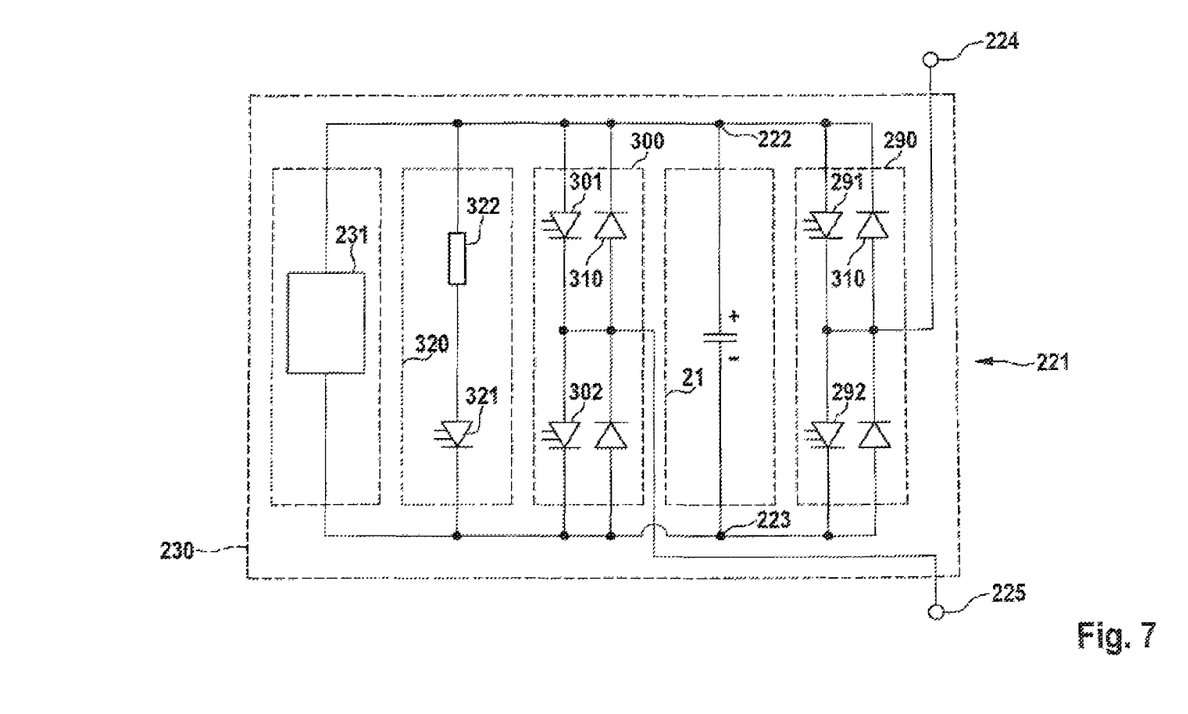
FIG. 7 is the basic circuit diagram of a battery cell unit according to a third embodiment of the disclosure.

FIG. 7 illustrates the basic circuit diagram of a battery cell unit 221 according to a third embodiment of the disclosure. This battery cell unit 221 comprises a battery cell 21 and a monitoring device 230 for monitoring the state of the battery cell. The monitoring device 230 comprises a switching actuator mechanism which in this case comprises a second voltage setting device which is provided to set a voltage present across the battery cell terminals 224, 225, which voltage corresponds to the battery cell voltage in positive orientation or negative orientation.

The second voltage setting device is formed from two half-bridges 290, 300 with in each case two power semiconductors (power semiconductor switches). The one half-bridge 290 comprises the power semiconductors 291 and 292. The other half-bridge 300 comprises the power semiconductors 301 and 302. The two half-bridges 290, 300 together form a full-bridge circuit with four power semiconductors 291, 292, 301, 302. A diode 310 is connected in each case in parallel with the power semiconductors 291, 292, 301, 302, the forward direction of which diodes runs contrary to the forward direction of the corresponding power semiconductor. To simplify the illustration, only one diode per half-bridge 290, 300 is provided with the reference sign 310.

The power semiconductor 291 of the one half-bridge 290 is directly connected to the positive battery cell pole 222 at a first connection of the one half-bridge 290. Furthermore, the other power semiconductor 292 of the one half-bridge 290 is directly connected to the negative battery cell pole 223 at a second connection of the one half-bridge 290. Said one half-bridge 290 is also directly connected to a first output terminal 224 of the battery cell unit 221 at a central connection.

The power semiconductor 301 of the other half-bridge 300 is directly connected to the positive battery cell pole 222 at a first connection of said other half-bridge 300. Furthermore, the other power semiconductor 302 of the other half-bridge 300 is directly connected to the negative battery cell pole 223 at a second connection of said other half-bridge 300. Said other half-bridge is also directly connected to a second output terminal 225 of the battery cell unit 221 at a central connection.

The battery cell unit 221 according to the third embodiment of the disclosure comprises an ultra-fast discharge device (UFDD) 320 which has a series circuit composed of a power semiconductor (power semiconductor switch) 321 and a resistor 322 connected between the positive battery cell pole 222 and the negative battery cell pole 223. The ultra-fast discharge device 320 is provided in the battery cell unit 221 to discharge the battery cell 21 by means of a discharge current flowing through the ultra-fast discharge device 310.

The monitoring device of the battery cell unit 221 according to the disclosure also comprises a monitoring unit 231 connected between the battery cell poles 222, 223 which comprises a control device (control circuit) for controlling the five power semiconductors 291, 292, 301, 302, 321 and is not separately illustrated.

The power semiconductors 291, 292, 301, 302 can be controlled by means of the control device such that they operate in switching operation. In this case, the power semiconductors 291, 292, 301, 302 operating in switching operation can be switched by means of the control device such that the battery cell 21 can output the battery cell voltage across the battery cell terminals 224, 225 in positive or negative orientation.

The power semiconductor (power semiconductor switch) 321 of the ultra-fast discharge device 320 can be controlled by means of the control device in switching operation such that the battery cell 21 can be discharged by means of a discharge current close to the short-circuit current flowing through the ultra-fast discharge device 310.

The power semiconductors 291, 292, 301, 302 of the second voltage setting device and/or the power semiconductor 321 of the ultra-fast discharge device 320 can in each case be designed as metal oxide semiconductor field-effect transistors (MOSFETs).

If the monitoring device 230 of the battery cell unit 221 is integrated in the battery cell 21, the battery cell unit 221 according to the third embodiment of the disclosure forms a battery cell with intrinsic electrical safety with an output voltage for which the polarity can be changed and an ultra-fast discharge device.

In order to be able to perform impedance spectroscopy with the arrangement illustrated in FIG. 7, either the power semiconductor 321 in the ultra-fast discharge device 320 or at least one of the power semiconductors 291, 292, 301, 202 of the full-bridge circuit must be configured such that said power semiconductor can be operated in the active region. In order to be able to operate a power semiconductor in the active region, the control device must be configured such that it can control the at least one power semiconductor switch configured for operation in the active region in a linear fashion, also in the case of the battery cell unit 221 according to the third embodiment, too.

By means of the at least one power semiconductor of the power semiconductors 291, 292, 301, 202, 321 which is controllable in the active region, it is possible to realize current regulation here, too. Using the actively operated power semiconductor, a linearly operating actuator is then provided, by means of which a current regulating circuit is also realized in this case for the current which flows through the battery cell (the electrochemical part of the battery cell unit) 21. Said current can optionally also have an external current (bypass current) superposed thereon, which flows between the battery cell terminals directly through the power semiconductors of the full-bridge circuit without being conducted via the battery cell 21.

If one of the power semiconductors 291, 301 of the full-bridge circuit which are directly connected to the positive battery cell pole 222 is configured for operation in the active region (active operation), the battery cell 21 can optionally be operated via the power semiconductors 292, 302 of the full-bridge circuit which are directly connected to the negative battery cell pole 223 in the current bypass for conducting the external currents (bypass currents), or vice versa, if one of the power semiconductors 292, 302 of the full-bridge circuit which are directly connected to the negative battery cell pole 223 is used for impedance spectroscopy.

In order to perform impedance spectroscopy, a sinusoidal current profile is expediently predefined here, too, as nominal predefined value for the battery cell current for the current regulating circuit realized by means of the at least one power semiconductor operated in the active region. In order to detect the battery cell current and the voltage response of the battery cell 21, a sensor device (sensors) of the battery cell unit 221 which is arranged in the monitoring unit 231 and is not separately illustrated here is used. The complex internal resistance of the battery cell 21 over the frequency can be determined and/or recorded from the amplitude of the profile of the battery cell current, the phase shift and the amplitude of the voltage response of the battery cell 21, preferably by means of a state identification device of the battery cell unit (battery cell state detection and prediction) 221 which is arranged in the monitoring unit 231 and is not separately illustrated here.

By means of the battery cell unit 221 according to the second or third embodiment of the disclosure (the arrangements illustrated in FIGS. 6 and 7), the complex internal resistance of the battery cell 21 over the frequency can be determined and/or recorded by means of impedance spectroscopy. Important information about the state of the battery cell can be obtained from the profile of the impedance over the frequency. By way of example, it can also be detected from the profile of the impedance over the frequency when the two electrodes of a battery cell 21 age at different rates.

Said aging effect cannot be determined via a capacity measurement of the battery cell 21, or only in a very limited manner. If the battery cell 21 is a lithium-ion battery cell, faster aging of the anode, which can be detected by the presence of a capacity reduction which is progressing quicker than usual, can lead, for example, to the charging current limit value for avoiding lithium plating being set too high and the lithium-ion battery cell already exhibiting lithium plating even at currents below the calculated limit value. This can cause growth of battery cell-internal dendrites which can lead to damage of the separator of the lithium-ion battery cell, which can bring about a battery cell-internal electrical short circuit. Owing to such a battery cell-internal short circuit, local heating of the affected battery cell can occur, which can lead to thermal runaway of said battery cell.

By means of the battery cell units 221 according to the disclosure in accordance with the second or the third embodiment of the disclosure (the arrangements illustrated in FIGS. 6 and 7), impedance spectroscopy can be performed in a very simple manner in the case of suitable configuration of the control device with respect to the control of the power semiconductors and the sensor device (sensors) used to detect the battery cell current and the battery cell voltage. Hence, the state identification device is provided with significantly better information about the state of the battery cell than is possible according to the present prior art. This information can be used to improve the quality of the battery state detection and prediction and/or to increase the safety of a battery cell 21 or a battery system with a battery having a plurality of such battery cells 21.

In addition to the above written disclosure, reference is hereby additionally made, for additional disclosure, to the illustration in FIGS. 1 to 7.

What is claimed is:

1. A battery cell unit comprising:
    a battery cell having positive and negative battery cell poles;
    a sensor device configured to detect measurement currents of the battery cell and a measurement voltages of the battery cell;
    an actuator device comprising at least one power semiconductor switch connected between the positive and negative battery cell poles of the battery cell; and
    a monitoring device programmed to, in an impedance spectroscopy mode, (i) operate the at least one power semiconductor switch of the actuator device in a linear region to apply impedance spectroscopy currents to the battery cell, the impedance spectroscopy currents including at least a first alternating current at a first frequency and a second alternating current at a second frequency, the second frequency being different than the first frequency, and (ii) determine a complex impedance of the battery cell based on the measurement currents and the measurement voltages provided by the sensor device that arise in response to the application of the impedance spectroscopy currents.

2. The battery cell unit according to claim 1, wherein the sensor device is configured to detect the measurement currents and measurement voltages at least one of simultaneously, with a predetermined repetition rate, and with a predetermined measurement accuracy.

3. The battery cell unit according to claim 1, wherein the monitoring device is further programmed to:
    determine, based on the measurement currents and measurement voltages provided by the sensor device, amplitudes of the measurement currents and the measurement voltages and phase shifts between the measurement currents and corresponding measurement voltages;
    determine, from the determined amplitudes and phase shifts, the complex impedance of the battery cell as a function of frequencies of the measurement currents;
    record the complex impedance of the battery cell as a function of the frequencies of the measurement currents; and
    evaluate a dependency of the complex impedance on the frequencies of the measurement currents.

4. The battery cell unit according to claim 3, wherein the monitoring device is further programmed to obtain information about a present or future state of the battery cell based on the evaluation of the dependency of the complex impedance on the frequencies of the measurement currents.

5. The battery cell unit according to claim 1, wherein the actuator device is at least one of:
    an discharge device configured to discharge the battery cell with a predetermined discharge current, and having a power semiconductor switch connected to battery cell poles;
    a first voltage setting device configured to set a voltage present at battery cell terminals that corresponds to a battery cell voltage in positive orientation or to a voltage of 0 V, and having a half-bridge having two power semiconductors switches that are in each case directly connected to one of the battery cell poles; and
    a second voltage setting device configured to set a voltage present at the battery cell terminals, the voltage corresponding to the battery cell voltage in positive or negative orientation, having has two half-bridges each including two power semiconductors switches that are in each case directly connected to one of the battery cell poles.

6. The battery cell unit according to claim 5, wherein:
    a first power semiconductor of the first voltage setting device is directly connected to the positive battery cell pole and is configured for operation in the linear region and a second power semiconductor of the first voltage setting device is directly connected to the negative battery cell pole and is configured to conduct an external current flowing between the battery cell terminals via a first current path external to the battery cell; or
    at least one of a first and a second power semiconductor of the second voltage setting device is directly connected to the positive battery cell pole or the negative battery cell pole and is configured for operation in the linear region, and a third and fourth power semiconductor of the second voltage setting device is directly connected to the negative battery cell pole or the positive battery cell pole and is configured to conduct an external current flowing between the battery cell terminals via a second current path external to the battery cell.

* * * * *